(12) United States Patent
Maor et al.

(10) Patent No.: US 8,504,960 B2
(45) Date of Patent: Aug. 6, 2013

(54) METHOD AND SYSTEM FOR HIGH SPEED AND LOW MEMORY FOOTPRINT STATIC TIMING ANALYSIS

(75) Inventors: Guy Maor, San Jose, CA (US); Chih-Wei Jim Chang, Fremont, CA (US); Yuji Kukimoto, Fremont, CA (US); Haobin Li, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 438 days.

(21) Appl. No.: 12/451,308

(22) PCT Filed: May 16, 2008

(86) PCT No.: PCT/US2008/006283
§ 371 (c)(1),
(2), (4) Date: Nov. 5, 2009

(87) PCT Pub. No.: WO2008/153667
PCT Pub. Date: Dec. 18, 2008

(65) Prior Publication Data
US 2010/0131911 A1    May 27, 2010

Related U.S. Application Data

(60) Provisional application No. 60/931,367, filed on May 22, 2007.

(51) Int. Cl.
*G06F 9/455*    (2006.01)
*G06F 17/50*    (2006.01)

(52) U.S. Cl.
USPC ............................ 716/113; 716/108; 716/110

(58) Field of Classification Search
USPC .......................................................... 716/113
See application file for complete search history.

(56) References Cited

U.S. PATENT DOCUMENTS

| 7,181,383 | B1 * | 2/2007 | McGaughy et al. ............ 703/14 |
| 2002/0002701 | A1 | 1/2002 | Usami et al. |
| 2003/0070150 | A1 | 4/2003 | Allen et al. |
| 2004/0034678 | A1 | 2/2004 | Kuszmaul et al. |
| 2007/0192766 | A1 * | 8/2007 | Padalia et al. ................. 718/105 |

OTHER PUBLICATIONS

PCT International Search Report, PCT Application No. PCTUS2008006283, Sep. 2, 2008, 3 pages.
PCT Written Opinion, PCT Application No. PCTUS2008006283, Sep. 2, 2008, 4 pages.

* cited by examiner

*Primary Examiner* — Vuthe Siek
*Assistant Examiner* — Eric Lee
(74) *Attorney, Agent, or Firm* — Fenwick & West LLP

(57) ABSTRACT

The invention provides a method and system for performing Static Timing Analysis on SoC (System on a Chip) designs. The invention solves a longstanding problem with timing analysis of designs, namely, the ability to multi-thread the design under analysis. The invention provides for slicing a design into levels, further decomposing each level into gates, and the multi-threaded processing of gates so that the solution of large design analysis is generated significantly faster than current approaches. Further, the invention provides that only one level exists in the RAM at any time. Once the arrival time on the level is computed, the data is saved to disk immediately. Because the memory footprint is sub-linear to the size of the design, entire system-on-a chip designs may be nm on inexpensive, off-the-shelf hardware.

18 Claims, 5 Drawing Sheets

METHOD AND SYSTEM FOR HIGH SPEED AND LOW MEMORY FOOTPRINT STATIC TIMING ANALYSIS

RELATED APPLICATIONS

This application claims priority from U.S. provisional application 60/931,367 of the same title, filed May 22, 2007, the entirety of which is incorporated by reference as if fully set forth herein.

GOVERNMENT FUNDING

N/A

FIELD OF USE

The invention relates to statistical timing analysis, and more particularly to timing analysis of large designs, including "System on-a-Chip" (SoC) designs.

BACKGROUND

A digital circuit can be represented as a set of interconnected logic gates. Static Timing Analysis (STA) is a method of computing the expected timing of a digital circuit without requiring expensive simulation. To perform static timing analysis, the arrival time at all the primary inputs are first annotated. Then the arrival time is propagated forward by adding delays along the interconnects and gates.
This process continues until all primary outputs are reached.

In current approaches, data generated during the arrival time propagation is all stored in the computer's random-access memory (RAM). The application's memory footprint is proportional to the size of the design. For modern system-on-a-chip (SoC) designs, traditional static timing analysis requires on the order of 30 GB (gigabytes) or more of memory. Owing to the memory needed, the hardware requirement can be prohibitively expensive. What is needed is a method and system for static timing analysis that operates using substantially less than 30 GB, even when the design is a SoC design.

Moreover, current approaches to static timing analysis process or execute only one thread at a time (FIG. 1A). Single threaded execution—executing a single thread at a time—makes, as current trend favors larger designs, for a correspondingly lengthy analysis time. Those of average skill in the relevant art are familiar with "gate" as a unit of design, and "thread" as a unit of execution.

Commencing with design input 11, all gates are levelized into a single sequential order 13. Beginning at a first gate 15, the gate is processed 17 and the analysis then proceeds to the next gate 19, until the last gate is reached 20 and the design analysis is done 21. It can be appreciated, then, that data flow requires significant RAM, as all the data for the entire design ins in RAM, all associated calculations—the results of the analysis—must all be accommodated in RAM.

What is needed is a method of performing static timing analysis such that the amount of required RAM does not increase as the size of the design under analysis increases. Further, what is needed is a faster approach to design analysis, including static timing analysis.

SUMMARY OF THE INVENTION

The invention satisfies at least all of the above-mentioned unmet needs. The invention provides a means to multi-thread the design under analysis, enabling high speed static timing analysis with a low memory footprint.

A system according to the invention, as sketched in FIG. 2A, includes an input means for a design under analysis 23, a master central processing unit or CPU 25 and a plurality of dependent CPUs 27, where each dependent CPU is connected to a Master CPU 25, a quantity of RAM (random access memory) 31 and output to a disk storage medium or Disk 33.

The invention provides uniquely effective implementation of inexpensive disk storage, random access memory (RAM) and a plurality of "off the shelf" CPUs (i.e. execution units). The invention provides a means for faster performance of timing analysis with reduced hardware expense.

The invention provides a method including partitioning the design under analysis into a set of levels. A level may be understood as a set of gates not interdependent either before or after each other; and gates are sent from the master CPU to additional CPUs for solution. In the preferred embodiment, each gate, is sent to one of a plurality of dependent CPUs for solution, such that which CPU is solving a given gate is and the solution of a given gate is independent of other gates. The plurality of dependent CPUs send the gate solutions to the Master CPU, which in turn, saves the solutions set for the level, and sends the level solution from random access memory (RAM) to a storage medium, such as a disk, for storage. Solution of the next level then commences, and the process is repeated until the entire set of levels comprising the design has been solved.

It can be appreciated by those of skill in the art that by partitioning the design into levels, less memory is required for the analysis of the design. Further cutting levels into gates, and the multi threading of the gate computation, provides a faster solution of the design as a whole. Thus the inventive method and system require less memory and less time to perform STA on large designs.

DETAILED DESCRIPTION OF THE PREFERRED EMBODIMENT

The inventive method and system can be further appreciated and understood by means of the figures accompanying the specification.

The invention provides a method of multi-threading analysis of a digital circuit design, said method including partitioning the design under analysis into a set of levels. A level may be understood as a set of gates not interdependent either before or after each other. From the master CPU, gates are sent to for solution to additional CPUs. The gates or tasks are solved independently, and the master CPU receives solutions from the dependent CPUs. When the entire level has been solved, the master CPU saves the solutions set for the level, and sends the level solution from random access memory (RAM) to a disk for storage. Solution of the next level then commences, and the process is repeated until the entire set of levels comprising the design has been solved.

Figure 1A:
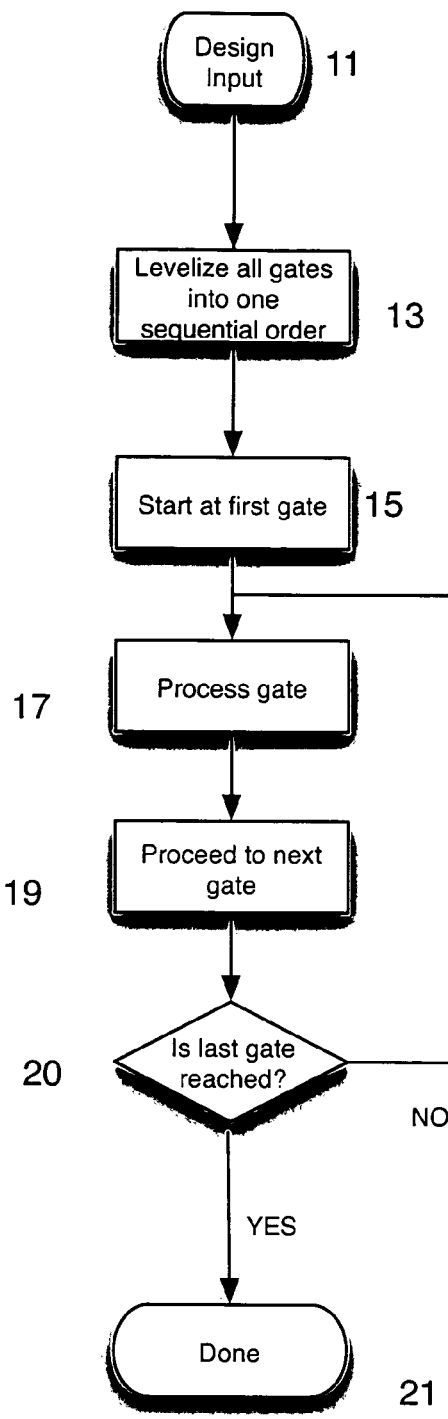
FIG. 1A depicts prior art method of design analysis.
Figure 2A:
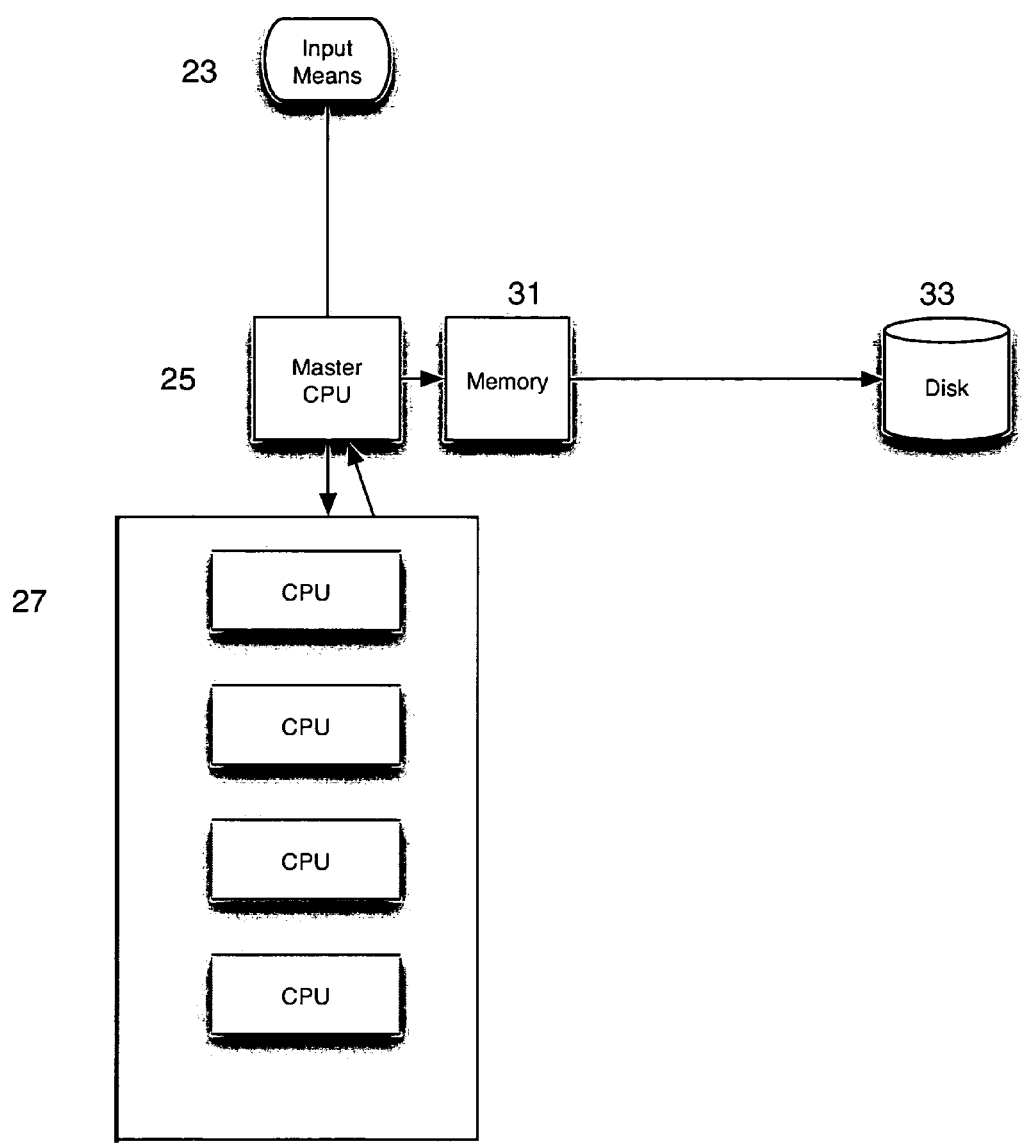
FIG. 2A depicts a system according to the invention.

Referring to FIG. 2A, a system according to the invention includes an input means for a design under analysis, a master CPU (central processing unit) and a plurality of dependent CPUs connected to the master CPU, a quantity of RAM (random access memory) and output to a storage medium. In the preferred embodiment, the dependent CPUs are multicore microprocessors. For designs of 40 million gates, four CPUs may be sufficient to achieve process time of less than one hour. Those of skill in the relevant arts can appreciate the significant improvement afforded by the invention taught herein, as current approaches typically require many hours to run a static timing analysis (STA) on a 40 million gate design.

Again referring to FIG. 2A, a system according to the invention includes an input means for a design under analysis (User) 23, a master CPU 25 and a plurality of dependent CPUs 27, where each dependent CPU is connected to a Master CPU 25, a quantity of RAM (random access memory) 31 and output to a disk storage medium or Disk 33.

According to traditional data flow, all data required for design analysis is completely loaded from disk into physical memory. It is only after all data is in RAM (physical memory) that the CPU commences to perform analysis on the design under analysis. Sufficient RAM must exist to accommodate not only the data required for the design under analysis, but also all the results of the analysis. When the entire design analysis is completed, the results are sent from the RAM/CPU to a storage device. This approach requires sufficient RAM to contain the entire design as a whole as well as all the computed results. The larger the design, the more RAM required, and the cost increases as the amount of RAM required increases.

Figure 2B:
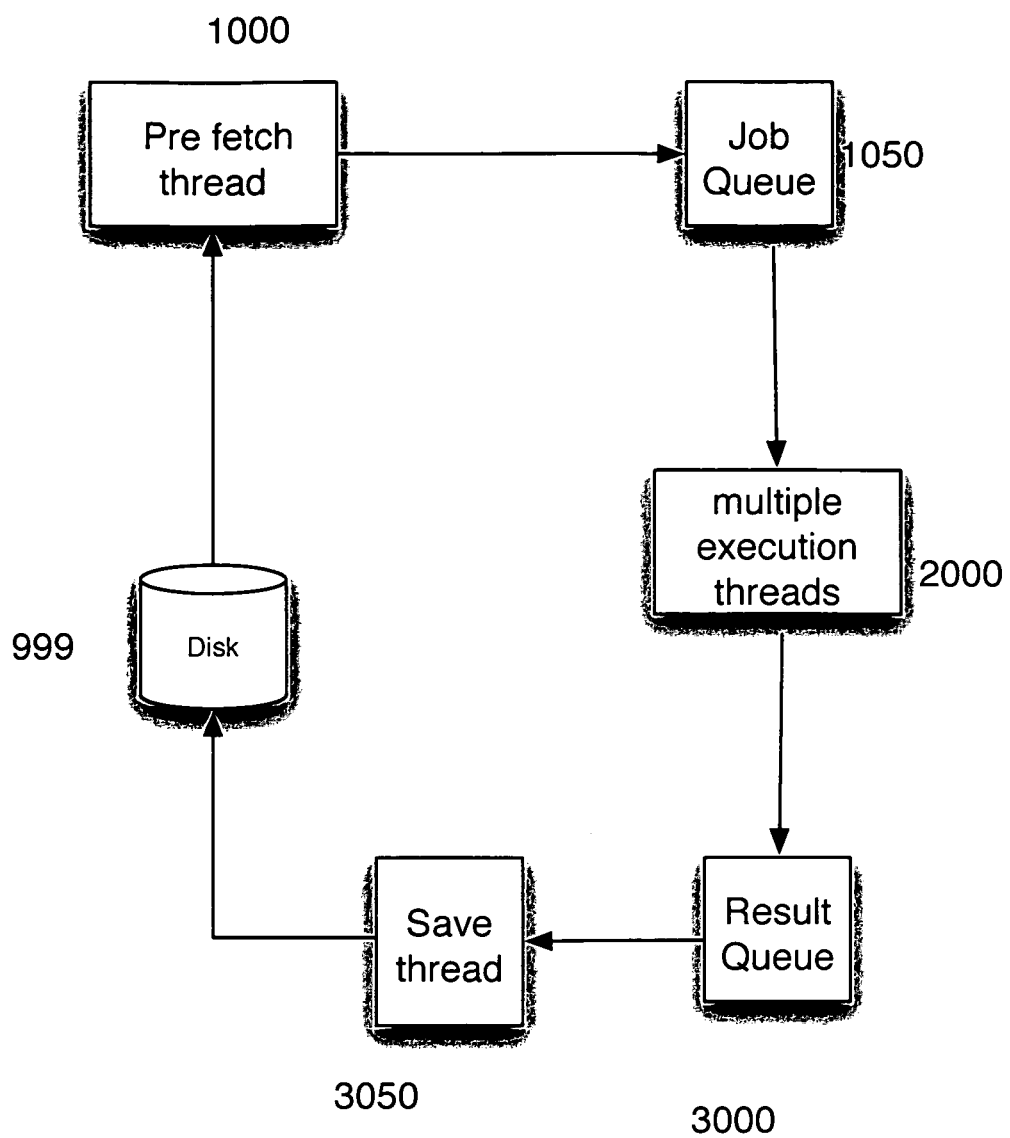
FIG. 2B depicts data flow view according to the invention.
Figure 2C:
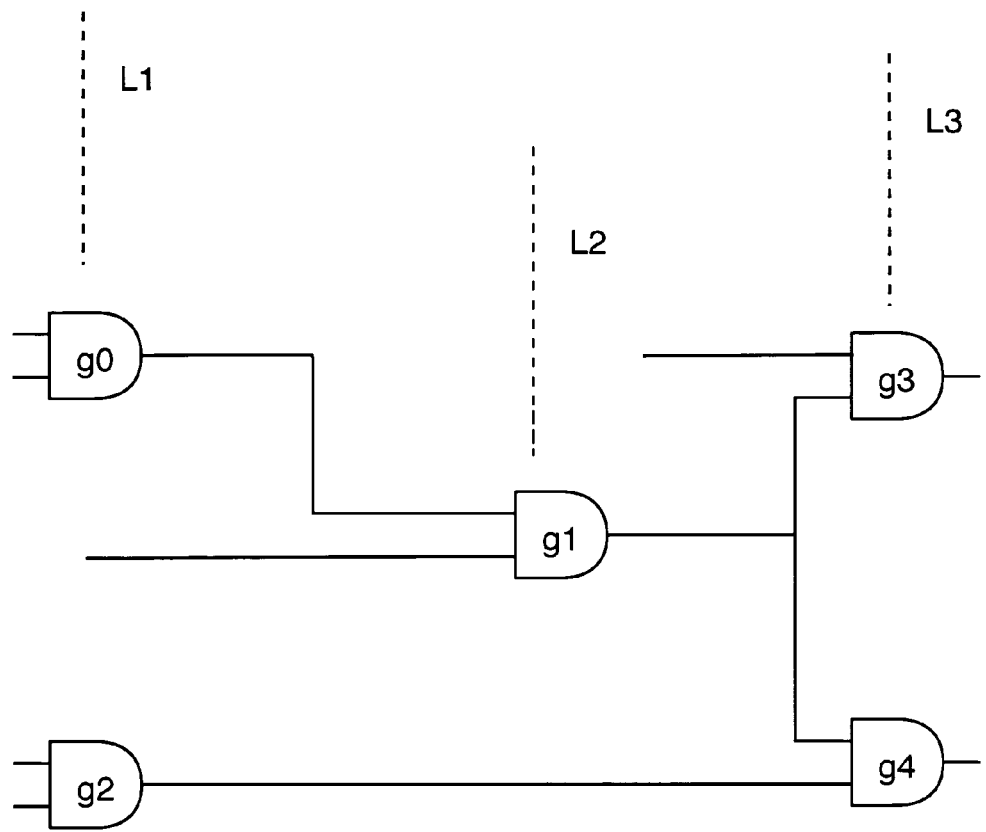
FIG. 2 C depicts an example of a structural view according to the inventions.

Referring to the example of five gates depicted in FIG. 2C, the traditional approach provides that all data is loaded into physical memory during analysis. Thus, gate 0, gate 1, gate 2, gate 3, gate 4, gate n are all loaded into RAM, even though gate 3 can only be computed after g0 and g1 are finished.

Referring now to FIG. 2B depicting data flow according to an embodiment of the inventions, illustrates the manner in which threads work independently of each other with minimal synchronization, depending on the queue status (i.e. the job queue and result queue).

A pre-fetch thread 1000 loads data from disk 100 and saves the prepared data into a Job Queue. The term "job" as used herein, means all the data needed to perform gate computations in a particular level. For each job, the execution threads 2000 compute the arrival time, transition time, and crosstalk for all gates in the level. The computation results are saved to the Result Queue 3000.

It is important to note that at such time as a job is deposited to the Job Queue 1050 the pre fetch thread 1000 can immediately load the data for the next level, and so on until all the levels of the design under analysis have been deposited as jobs in the Job Queue. The prefetch thread does not need to wait for the execution threads (see 2000) to consume the job, i.e pull from 1000 and send to 3000. In this manner, the pre-fetch thread 1000 works independently of the execution threads 2000.

Moreover, the execution threads can proceed with the next job in the Job Queue without waiting for the results to be physically saved to disk. A Save thread 3000 removes each job from the Result Queue and saves each job to disk. When all the gate computations for every level have been completed, and saved to disk, the design analysis is complete. It can be appreciated that the data flow of the inventive embodiment is significantly faster than single threaded or even currently employed so-called multithreaded approaches. In addition embodiments according to the invention use significantly smaller memory footprints than currently employed approaches.

To further appreciate the inventive approach, it is useful to consider the inventive approach to levelization of a design under analysis. Referring now to FIG. 2C in which a five gate structure is depicted. In the levelization the inventive approach differs from current practice. Those of average skill in the relevant art understand "levelization" to mean a traversal assigning a level to each gate such that if a gate B is at the fanout cone of gate A, then the level of A is smaller than the level of B.

In current approaches, levelization of the structure in FIG. 2C would yield:

Ex: Prior Art Levelization

| g0 | g1 | g2 | g3 | g4 |
|---|---|---|---|---|
| Level 1 | Level 2 | Level 3 | Level 4 | Level 5 |

However, according to the invention, levelization accomplishes "maximum packing" such that where there is no dependency, the level is reduced as much as possible. The labels L1, L2 and L3 depict the concept of "maximum packing" so the levels yield:

Ex: Maximum Packing Levelization

| g0 | g1 | g2 | g3 | g4 |
|---|---|---|---|---|
| Level 1 | Level 2 | Level 1 | Level 3 | Level 3 |

Note that in the example, g2 can be reduced from level 3 to level 1, g3 reduced from level 4 to level 3, and g4 can be reduce from level 5 to level 3. One of skill in the relevant art further appreciates that a variety of mathematical approaches may be taken to analyze a design so as to cut it into levels, and accomplish maximum packing. Any of these are intended to be included if performed in embodiments of the invention described herein.

Figure 3:
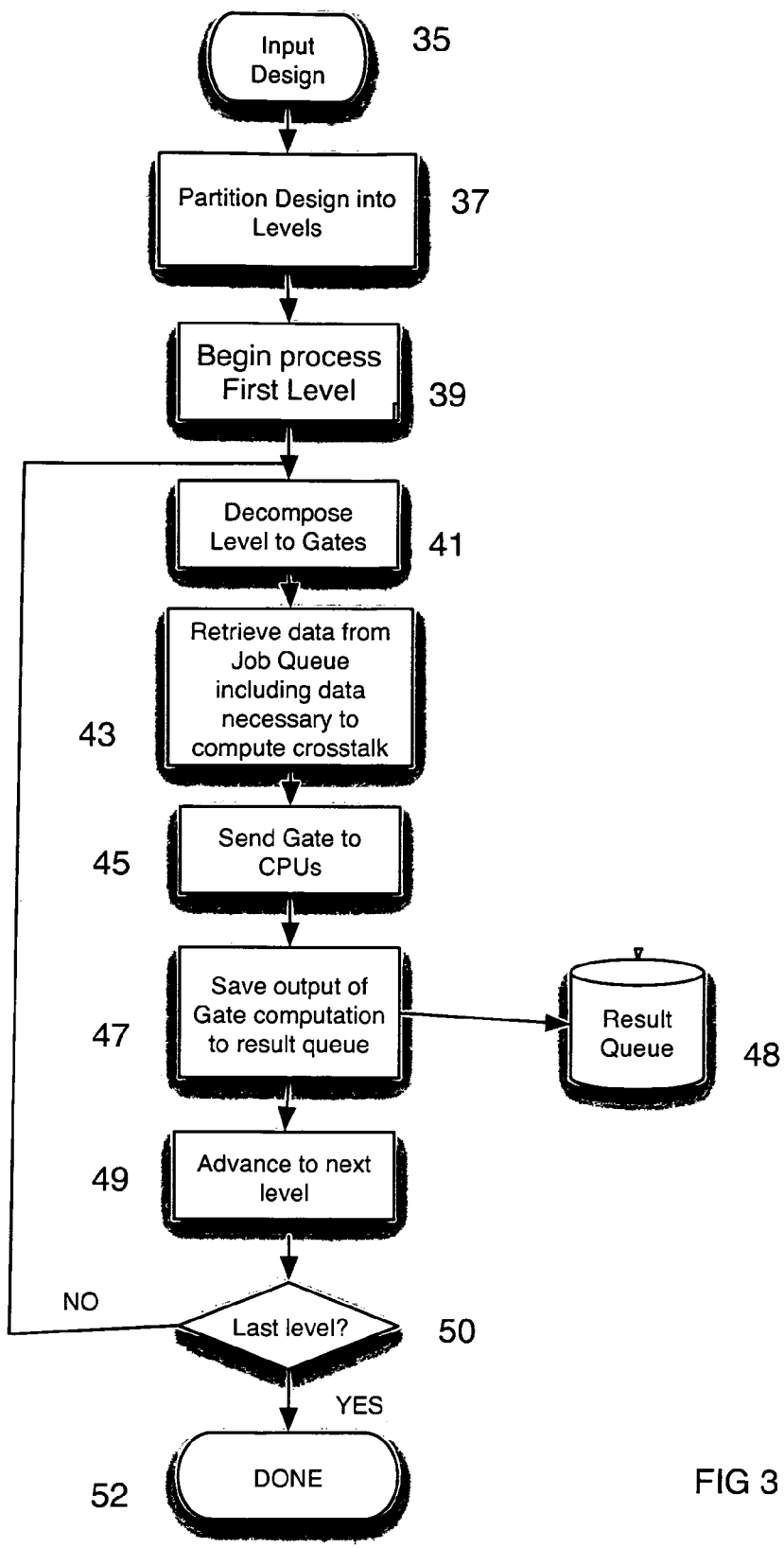
FIG. 3 is a block diagram of an embodiment of the inventive method.

Referring now to FIG. 3, the method according to the invention comprises the steps of: inputting design 35, partitioning the design into levels and analyzing for crosstalk 37; beginning process first level 39; decompose level into gates 41; retrieve data from Job Queue 43 including data necessary to compute crosstalk; send gates to CPUs 45; save output of gate computation 47 to Results Queue 48; advance to next level 49; determine if last level 50; if not the last, return to next level and repeat steps 41 through 50; when last level completed, then process is complete 52.

Current methods require sufficient memory to accommodate the entire design (i.e. all the gates) as well as the computations for all the gates. In embodiments according to the invention, as a consequence of partitioning the design and through levelization techniques such as maximum packing, it is only necessary to accommodate a sub set of the design in memory at any time, and in the preferred embodiment, only one level of the design at any time. Therefore the memory required is a function of the size of the largest level, not the size of the design. Further, as a practical matter, packing heuristic determines level size and it has been empirically determined that the desired level size is a level comprised of several hundred gates. For a SoC design where the system uses multicore CPUs, a level of about 500 gates realizes best performance speed. The level size optimization my vary depending on hardware, and levelization algorithm employed.

It can be appreciated by those of skill in the art that by cutting the design into levels, less memory is required to analyze and store the design. Further cutting levels into gates provides a faster solution. Thus the inventive method and system require less memory and less time to perform STA on large designs. In the preferred embodiment, a level generally is comprised of several hundred gates, ensuring that the level is neither to large or too small for optimal STA performance.

The inventive method and system taught herein can provide crosstalk analysis on a design under analysis. Crosstalk complicates a timing analysis of a design because crosstalk creates an even greater number of dependencies. The inventive approach is effective in performing crosstalk analysis. In the preferred embodiment, because retrieval of stored data is required in a crosstalk analysis, a preliminary analysis informs and directs a storage protocol whereby later needed data is rapidly retrieved from disk storage.

The preliminary analysis analyzes the design topology to determine how to save gates, in light of dependencies, so as to render the saved data amenable to rapid retrieval.

In a further embodiment, where it is desirable to vary parameters, the data design input can branch out and run simultaneously on the hardware as described hereinabove. This obviates sequential running of the design multiple times, and provides faster results. This is especially useful for multi-corner multi-mode analysis.

In a system and method according to the preferred embodiment, only one level exists in the RAM at any time. Once the arrival time on the level is computed, the data is saved to disk immediately. Accordingly, the inventive method is extremely efficient in use of available RAM. Because the memory footprint is sub-linear to the size of the design, entire system-on-a-chip (SoC) designs may be run on inexpensive, off-the-shelf hardware. Designs of, for example, 50 million gates, can be accommodated according to the inventions, as well as larger designs owing to the scalability of the invention.

Moreover, owing to the inventive decomposition of the design into levels, and further decomposition into gates and the multiple processing of gates, the solution of large design analysis is generated significantly faster than current approaches.

We claim:

1. A method for performing static timing analysis on a circuit the method comprising:
   (a) partitioning, a circuit design represented as interconnected gates into a plurality of levels, each of a plurality of gates in at least a level having an input that is independent of outputs of other gates in the same level;
   (b) initializing a first set of gates belonging to a first level as a current set of gates belonging to a current level;
   (c) performing static timing analysis of the circuit design for each level of the circuit design, comprising:
      (c1) assigning a set of multiple execution threads to a plurality of processors to perform static timing analysis for the current set of gates;
      (c2) storing the results of the static timing analysis for the current set of gates in a storage medium; and
      (c3) responsive to determining that a next level exists, using the results of the static timing analysis of the current level as arrival times for gates of the next level, updating a set of gates in the next level as the current set of gates, updating the next level as the current level, and repeating (c1) through (c3).

2. The method as in claim 1, wherein data associated with the current level is stored in a job queue, and before the set of execution threads have been pulled from the job queue, the next level is stored in the job queue.

3. The method as in claim 1, wherein a next set of execution threads for the next level commences processing without waiting for the results of the current level to be stored in the storage medium.

4. The method as in claim 1, wherein (a) partitioning said design into levels includes selecting a level size that is optimized for rapid processing and ensuring levelization is performed with maximum packing.

5. The method of claim 1, wherein (c) performing the static timing analysis further comprises:
   responsive to determining that there is no next level, storing the results of the static timing analysis of the current level.

6. The method of claim 1, wherein (c) performing the static timing analysis comprises:
   at each level, determining arrival times at gates in the current level.

7. The method of claim 1, wherein (c) performing the static timing analysis comprises:
   at each level, determining transition times through gates in the current level.

8. The method of claim 1, wherein performing static timing analysis comprises:
   at each level, performing crosstalk analysis for gates in the current level.

9. A system for performing static timing analysis on a circuit, the system comprising:
   a master processor and a memory coupled to the master processor storing instructions to:
      (a) partition, a circuit design represented as interconnected gates into a plurality of levels, each of a plurality of gates in at least a level having an input that is independent of outputs of other gates in the same level;
   a dependent processor and a memory coupled to the dependent processor storing instructions to:
      (b) initialize a first set of gates belonging to a first level as a current set of gates belonging to a current level;
      (c) perform static timing analysis of the circuit design for each level of the circuit design, comprising instructions to:
         (c1) assign a set of multiple execution threads to a plurality of processors to perform static timing analysis for the current set of gates;
         (c2) store the results of the static timing analysis for the current set of gates in a storage medium; and
         (c3) responsive to determining that a next level exists, use the results of the static timing analysis of the current level as arrival times for gates of the next level, update a set of gates in the next level as the current set of gates, update the next level as the current level, and repeat (c1) through (c3).

10. The system of claim 9, wherein instruction to (c) perform static timing analysis further comprise instructions to:
    responsive to determining that there is no next level, store the results of the static timing analysis of the current level.

11. The system of claim 9, wherein instruction to (c) perform static timing analysis further comprise instructions to:
    at each level, determine arrival times at gates in the level.

12. The system of claim 9, wherein instruction to (c) perform static timing analysis further comprise instructions to:
    at each level, determine transition times through gates in the level.

13. The system of claim 9, wherein instruction to (c) perform static timing analysis further comprise instructions to:

at each level, perform crosstalk analysis for gates in the level.

14. A non-transitory computer readable storage medium storing computer readable instructions configured to:
  (a) partition, a circuit design represented as interconnected gates into a plurality of levels, each of a plurality of gates in at least a level having an input that is independent of outputs of other gates in the same level;
  (b) initialize a first set of gates belonging to a first level as a current set of gates belonging to a current level;
  (c) perform static timing analysis of the circuit design for each level of the circuit design, comprising instructions to:
    (c1) assign a set of multiple execution threads to a plurality of processors to perform static timing analysis for the current set of gates;
    (c2) store the results of the static timing analysis for the current set of gates in a storage medium; and
    (c3) responsive to determining that a next level exists, use the results of the static timing analysis of the current level as arrival times for gates of the next level, update a set of gates in the next level as the current set of gates, update the next level as the current level, and repeat (c1) through (c3).

15. The non-transitory computer readable storage medium of claim 14, wherein instruction to (c) perform static timing analysis further comprise instructions to:
  responsive to determining that there is no next level, store the results of the static timing analysis of the current level.

16. The non-transitory computer readable storage medium of claim 14, wherein instruction to (c) perform static timing analysis further comprise instructions to:
  at each level, determine arrival time at gates in the level.

17. The non-transitory computer readable storage medium of claim 14, wherein instruction to (c) perform static timing analysis further comprise instructions to:
  at each level, determine the transition time through gates in the level.

18. The non-transitory computer readable storage medium of claim 14, wherein instruction to (c) perform static timing analysis further comprise instructions to:
  at each level, perform crosstalk analysis for gates in the level.

\* \* \* \* \*

UNITED STATES PATENT AND TRADEMARK OFFICE
CERTIFICATE OF CORRECTION

| | | |
|---|---|---|
| PATENT NO. | : 8,504,960 B2 | Page 1 of 1 |
| APPLICATION NO. | : 12/451308 | |
| DATED | : August 6, 2013 | |
| INVENTOR(S) | : Guy Maor et al. | |

It is certified that error appears in the above-identified patent and that said Letters Patent is hereby corrected as shown below:

On the title page, item (57) in the Abstract, second to the last line, after "designs," delete "may be nm" and replace with --may be run on--

Signed and Sealed this
Twenty-third Day of September, 2014

Michelle K. Lee
*Deputy Director of the United States Patent and Trademark Office*